United States Patent [19]
Yamaguchi et al.

[11] Patent Number: 5,978,884
[45] Date of Patent: Nov. 2, 1999

[54] SEMICONDUCTOR MEMORY DEVICE HAVING A SINGLE LINE DATA BUS AND LATCH CIRCUITS FOR IMPROVED PIPELINE OPERATIONS

[75] Inventors: Shusaku Yamaguchi; Atsushi Hatakeyama; Masato Takita; Tadao Aikawa; Hirohiko Mochizuki, all of Kanagawa, Japan

[73] Assignee: Fujitsu Limited, Kanagawa, Japan

[21] Appl. No.: 08/880,890

[22] Filed: Jun. 23, 1997

[30] Foreign Application Priority Data

Dec. 20, 1996 [JP] Japan .................................. 8-340892

[51] Int. Cl.$^6$ .............................. G06F 13/00; G11C 7/00; G11C 19/00
[52] U.S. Cl. ......................... 711/100; 711/104; 711/109; 711/169; 365/189.05; 365/189.12
[58] Field of Search ..................................... 711/169, 104, 711/105, 109, 100; 365/189.12, 189.05, 190, 227

[56] References Cited

U.S. PATENT DOCUMENTS

| | | | |
|---|---|---|---|
| 4,675,850 | 6/1987 | Kumanoya et al. ................ | 365/230.01 |
| 4,800,530 | 1/1989 | Itoh et al. ........................... | 365/189.12 |
| 5,025,419 | 6/1991 | Nishino .............................. | 365/189.12 |
| 5,200,925 | 4/1993 | Morooka ................................. | 365/219 |
| 5,392,254 | 2/1995 | Toda .................................... | 365/189.12 |
| 5,521,877 | 5/1996 | Aimoto .............................. | 365/189.12 |
| 5,835,790 | 11/1998 | Nagai et al. ............................. | 395/551 |

*Primary Examiner*—Glenn Gossage
*Attorney, Agent, or Firm*—Nikaido Marmelstein Murray & Oram LLP

[57] ABSTRACT

A semiconductor memory device uses a wave pipeline system which can reduce a power consumption by reducing a current for charging a data bus between a memory core part and an output circuit. A single line data bus transmits read data output from the memory core part. A data bus drive circuit outputs the read read data to send to the single data bus. Each of a plurality of data latch circuits has a data input terminal connected to the data bus. A data input control circuit inputs the read data which is serially transmitted on the data bus to the data latch circuits in parallel in response to an operation of the data bus drive circuit. A data output control circuit outputs the latched read data in an order of latching by sequentially selecting outputs of the data latch circuits.

8 Claims, 9 Drawing Sheets

SEMICONDUCTOR MEMORY DEVICE HAVING A SINGLE LINE DATA BUS AND LATCH CIRCUITS FOR IMPROVED PIPELINE OPERATIONS

BACKGROUND OF THE INVENTION

1. Field of the Invention

The present invention generally relates to a semiconductor memory device and, more particularly, to a semiconductor memory device using a wave pipeline system which controls latency of data output by providing a data latch circuit near an output circuit.

Recently, in relation to an increase in processing speed of microprocessors, high-speed processing is required also for semiconductor memory devices. Thus, development of a semiconductor memory device having a pipeline technique is popular.

The pipeline technique effectively increases a processing speed by dividing a series of processes performed by a device so that a second process designated by a first instruction and a first process designated by a second instruction are initiated after a first process designated by the first instruction has been completed. The series of processes includes, in a case of a memory device, an input process of address data, a decoding process of the address data, a reading process of data from a cell, a transfer process of the data to an output circuit and an output process of the data.

Normally, in the pipeline technique, a plurality of processes which are to be serially processed are divided into a plurality of groups. Thus, process time for each group is equalized. The pipeline technique is achieved by providing a latch circuit on an output side of a process circuit which processes the divided processes. However, there are many cases, in a semiconductor memory device, where it is difficult to provide a latch circuit to a position where the process time is equalized.

Accordingly, in a semiconductor memory device, a pipe is formed by utilizing transmission delay of a logic circuit and a data latch circuit is provided near an output circuit so as to control latency of output of data. That is, a pipeline system, which is referred to as a wave pipeline, is used for controlling a timing of output of data based upon which clock the data is output after input of a read command.

2. Description of the Related Art

FIG. 1 is a circuit diagram of a part of a conventional synchronous dynamic random access memory (synchronous DRAM).

In FIG. 1, the synchronous DRAM comprises a memory core part 1, a NAND circuit 2, a shift register 3, a shift register 4, and a plurality of output circuit parts 5-n (n=0, 1, 2, . . . , 7), each including a plurality of data latch circuit 6-0 to 6-3 and a data output buffer 7.

The memory core part 1 includes a memory cell area in which a plurality of memory cells are arranged. Data buses RDn and /RDn (n=0, 1, 2, . . . , 7) are connected to the memory core part 1 so as to transfer read data from the memory core part 1. The data buses RDn and /RDn are complementarily driven.

The NAND circuit 2 monitors the data buses RD0 and /RD0 so as to produce a data bus status shift monitoring signal iCLK which indicates a shift in a status of the data buses RD0 and /RD0.

The shift register 3 changes an input pointer signal pi0 to a high logic level at a predetermined time period after a read command is input. Hereinafter, the high logic level is referred to as H-level, and a low logic level is referred to as L-level. For example, when a burst length is set to 4, the shift register 3 turns input pointer signals pi1, pi2 and pi3 to the H-level, sequentially one by one, by using the data bus status shift monitoring signal iCLK as a count-up clock.

The shift register 4 turns output pointer signals po0, po1, po2 and po3 to the H-level sequentially one by one each time an external clock signal CLK is raised when the burst length is set to 4 and when an output enable signal OE, which controls a data output operation, is at an H-level.

The output circuit parts 5-n are coupled to the respective data buses RDn and /RDn. The output circuit parts 5-n have the same circuit structure.

In the output circuit part 5-0, the data latch circuit 6-0 latches the data on the data buses RD0 and /RD0 when the input pointer signal pi0 is changed to the H-level. The data latch circuit 6-0 outputs the latched data when the output pointer signal po0 is changed to the H-level.

The data latch circuit 6-1 latches the data on the data buses RD0 and /RD0 when the input pointer signal pi1 is changed to the H-level. The data latch circuit 6-1 outputs the latched data when the output pointer signal po1 is changed to the H-level.

The data latch circuit 6-2 latches the data on the data buses RD0 and /RD0 when the input pointer signal pi2 is changed to the H-level. The data latch circuit 6-2 outputs the latched data when the output pointer signal po2 is changed to the H-level.

The data latch circuit 6-3 latches the data on the data buses RD0 and /RD0 when the input pointer signal pi3 is changed to the H-level. The data latch circuit 6-3 outputs the latched data when the output pointer signal po3 is changed to the H-level.

The data output buffer 7 latches the sequentially output data from the data latch circuits 6-0 to 6-3, and outputs output data DQ0 to a pad 8.

FIG. 2 is a timing chart of the synchronous DRAM shown in FIG. 1 when the burst length is set to 4. Waveform A in FIG. 2 indicates the external clock CLK. Waveform B in FIG. 2 indicates the output enable signal OE. Waveform C in FIG. 2 indicates a potential of the data buses RD0 and /RD0. Waveform D in FIG. 2 indicates the data bus status shift monitoring signal iCLK. Waveform E in FIG. 2 indicates the input pointer signals pi0, pi1, pi2 and pi3. Waveform F in FIG. 2 indicates a potential of nodes L0, /L0, L1, /L1, L2, /L2, L3, /L3 (shown in FIG. 3) of the data latch circuits 6-0, 6-1, 6-2 and 6-3. Waveform G in FIG. 2 indicates output pointer signals po0, po1, po2 and po3. Waveform H in FIG. 2 indicates the output data DQ0 output to the pad 8.

As mentioned above, in the synchronous DRAM shown in FIG. 1, the input pointer signal pi0 is changed to the H-level (pi0=H-level) when a read command is input. It should be noted that before the read data is output from the memory core part 1 to the data buses RD0, /RD0, RD1, /RD1 . . . , RD7 and /RD7, the data buses are precharged at the H-level by a data bus precharge circuit (not shown in the figure). FIG. 2 shows a case where data "logic 0", "logic 1", "logic 0" and "logic 1" are sequentially output to the data buses RD0 and /RD0.

When the data "logic 0" is output to the data buses RD0 and /RD0, the data bus RD0 is changed to the low level (RD0=L-level) and the data bus /RD0 is changed to the high level (/RD0=H-level). On the other hand, when the data "logic 1" is output to the data buses RD0 and /RD0, the data bus RD0 is changed to the high level (RD0=H-level) and the data bus /RD0 is changed to the low level (/RD0=L-level).

Accordingly, when the data buses RD0 and /RD0 are driven as shown by waveform C in FIG. 2, the data bus status shift monitoring signal iCLK output from the NAND circuit 2 changes as shown by waveform D in FIG. 2. The input pointer signals pi0, pi1, pi2 and pi3 change as shown by waveform E in FIG. 2.

As a result, the read data D0, D1, D2 and D3 which are sequentially output to the data buses RD0 and /RD0 are sequentially latched by the data latch circuits 6-0, 6-1, 6-2 and 6-3.

On the other hand, when the read command is input, the output enable signal OE is changed to the H-level as shown in waveform B in FIG. 2. Thus, the shift register 4 is changed to an active state. Thereafter, the output pointer signals po0, po1, po2 and po3 are changed to the H-level sequentially one by one as shown in waveform G in FIG. 2 each time the external clock CLK is raised.

As a result, the read data D0, D1, D2 and D3 which are sequentially latched by the data latch circuit 6-0, 6-1, 6-2 and 6-3 are transferred to the data output buffer in the latched order. Thus, the data D0, D1, D2 and D3 are sequentially output as the output data DQ0 to the pad 8.

In the conventional synchronous DRAM shown in FIG. 1, the wave pipeline operation is performed as mentioned above. Since the data buses RDn and /RDn transmit data by being complementarily driven by pulses, the data buses RDn and /RDn must be precharged so as to prepare for the transmission of data in the next cycle.

However, as the capacity of the synchronous DRAM is increased, the length of the data buses RD0, /RD0, RD1, /RD1, ..., RD7 and /RD7 tends to be increased. Thus, the charge and discharge current for the complementary pulse drive of the data buses RD0, /RD0, RD1, /RD1, ..., RD7 and /RD7 is considerably increased. Accordingly, if the number of bits is increased such as 16 bits, 32 bits or 64 bits, the current for driving the data buses becomes a problem.

When the data buses are pulse driven, a current l(1) consumed by a pair of data buses is represented by the following representation, where VCC is a power source voltage, C is a capacitance of the wire corresponding to the data buses and tCLK is a cycle time of the clock.

$$l(1)=C \times VCC/tCLK$$

Accordingly, if the number of input bits is 32, for example, the current l(32) consumed by the entire data buses is represented by the following representation.

$$l(32)=l(1) \times 32=32 \times C \times VCC/tCLK$$

For example, when the power source voltage VCC is 3 V (i.e., volts), the capacitance C is 3 pF (i.e., picofarads), and the cycle time tCLK is 6 ns (i.e., nanoseconds), the current l(32) reaches as high as 48 mA.

SUMMARY OF THE INVENTION

It is a general object of the present invention to provide a semiconductor memory device in which the above-mentioned problems are eliminated.

A more specific object of the present invention is to provide a semiconductor memory device using a wave pipeline system which can reduce power consumption by reducing a current for charging a data bus between a memory core part and an output circuit.

In order to achieve the above-mentioned objects, there is provided according to one aspect of the present invention a semiconductor memory device which comprises a single line data bus, a plurality of data latch circuits, a data input control circuit and a data output control circuit. The single line data bus transmits read data output from a memory core part of the semiconductor memory device. Each of the plurality of data latch circuits has a data input terminal connected to the data bus. The data input control circuit inputs the read data which is serially transmitted on the data bus to the data latch circuits in parallel. The data output control circuit is provided so as to output the latched read data in an order of latching by sequentially selecting outputs of the data latch circuits.

According to the above-mentioned invention, since a single line type bus line is provided so as to transmit the read data output from the memory core part, the data bus does not need to be precharged for each clock cycle. That is, the status of the data bus is shifted only once during a single clock cycle time. This reduces an operational frequency of the data bus to one half of that of the conventional memory device. Accordingly, a current needed to charge the data bus can be reduced to one half of that of the conventional memory device. Additionally, since the plurality of data latch circuits are provided, each of which has the input terminal connected to the data bus, a wave pipeline operation can be performed.

In the semiconductor memory device according to the present invention, the data input control circuit may monitor a shift in a status of the data bus so as to determine a timing of input of the read data to the data latch circuits. This invention facilitates control of a data input timing of the plurality of data latch circuits.

Additionally, the semiconductor memory device according to the present invention may further comprise a data bus drive circuit and a data bus potential holding circuit, the data bus drive circuit providing a potential to the data bus so as to output the read data to the data bus, the data bus potential holding circuit holding the potential provided by the data bus drive circuit. According to this invention, a structure which does not require a precharge of the data bus for each clock cycle can be achieved by a simple circuit structure.

Additionally, there is provided according to another aspect of the present invention, a semiconductor memory device which comprises a single data bus, a data pulse generating circuit, a plurality of first and second data latch circuits, a data input control circuit and a data output control circuit. The single data bus transmits read data output from a memory core part of the semiconductor memory device. The data pulse generating circuit includes a first data pulse line and a second data pulse line. The data pulse generating circuit generates first data pulses and second data pulses from the read data being transmitted through the data bus so that the first data pulses and the second data pulses are complementary with each other. The first data pulses are consecutively output to the first data pulse line and the second data pulses are consecutively output to the second pulse data line. Each of the plurality of first data latch circuits has an input terminal connected to the first data pulse line. Each of the plurality of second data latch circuits has an input terminal connected to the second data pulse line. The data input control circuit controls the first data latch circuits and the second data latch circuits to input the first data pulse to the first data latch circuits and to input the second data pulse to the second data latch circuits by sequentially turning the first data latch circuits and the second data latch circuits to a data input state. The data output control circuit controls the first data latch circuits and the second data latch circuits to sequentially output the read data in an order of latching by sequentially turning the first data latch circuits and the second data latch circuits to a data output state.

According to this invention, since a single bus line is provided so as to transmit the read data output from the memory core part, the data bus does not need to be precharged for each clock cycle. That is, the status of the data bus is shifted only once during a single clock cycle time. This reduces an operational frequency of the data bus to one half of that of the conventional memory device. Accordingly, a current needed to charge the data bus can be reduced to one half of that of the conventional memory device. Additionally, since the plurality of first data latch circuits and the plurality of second data latch circuits are provided, each of which has the input terminal connected to the data bus, a wave pipeline operation can be performed.

The semiconductor memory device according to the present invention may further comprise a data bus status shift monitoring signal generating circuit generating a data bus status shift monitoring signal indicative of a timing of shift in a status of the data bus by monitoring the shift in the status of the data bus. The data pulse generating circuit is controlled based on the data bus status monitoring signal to generate the first and second data pulses. Accordingly, a timing for generating the first and second data pulses can be controlled with a simple circuit structure.

Additionally, the data input control circuit may control a timing of input of the read data to the first and second data latch circuits based on the data bus status shift monitoring signal. Accordingly, a timing of input of the read data to the first and second data latch circuits can be easily controlled by the data bus status shift monitoring signal.

Additionally, the semiconductor memory device according to the present invention may further comprise a data bus drive circuit and data bus potential holding circuit, the data bus drive circuit providing a potential to the data bus so as to output the read data to the data bus, the data bus potential holding circuit holding the potential provided by the data bus drive circuit. According to this invention, a structure which does not require a precharge of the data bus for each clock cycle can be achieved by a simple circuit structure.

Other objects, features and advantages of the present invention will become more apparent from the following detailed description when read in conjunction with the accompanying drawings.

DETAILED DESCRIPTION OF THE PREFERRED EMBODIMENTS

Figure 1:
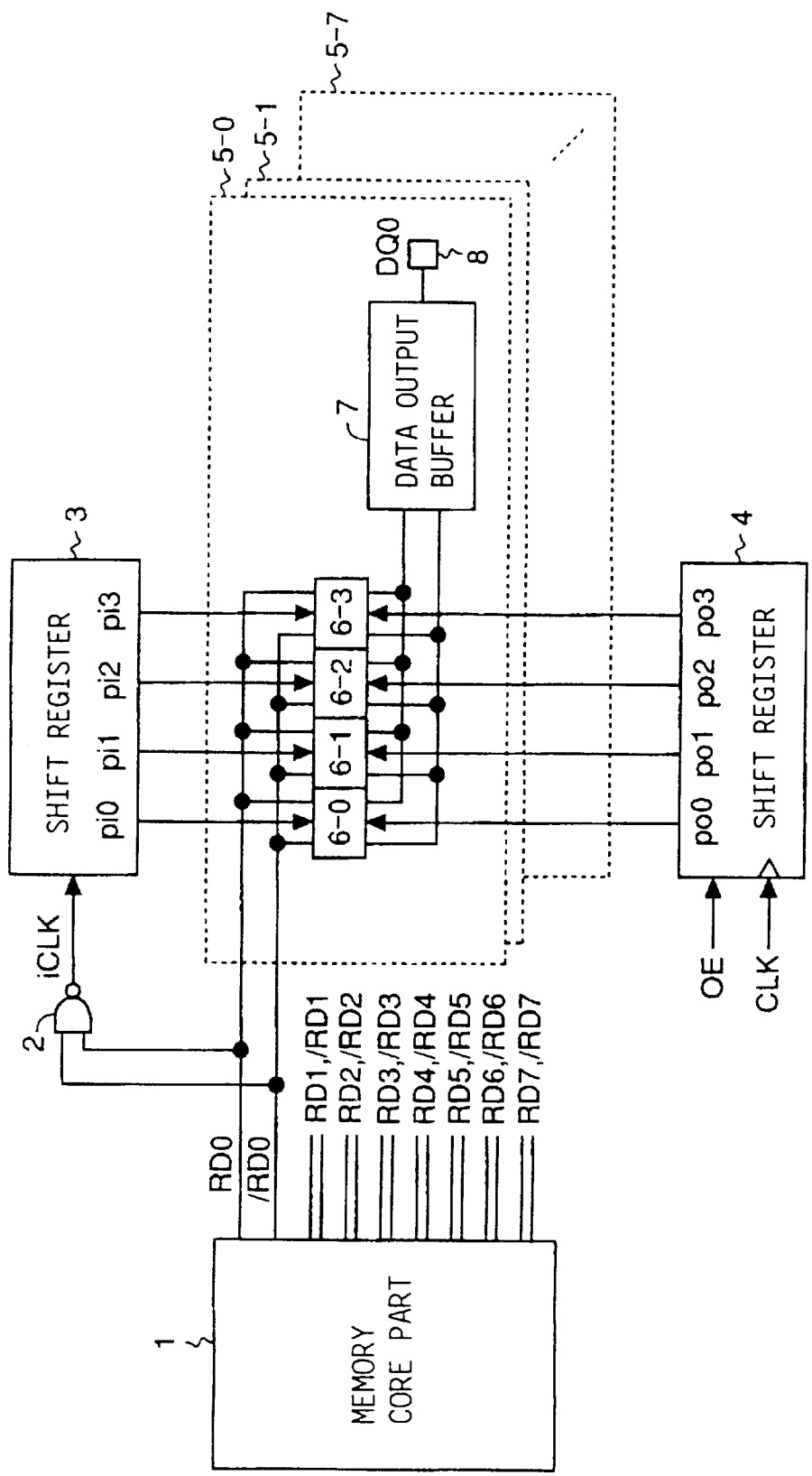
FIG. 1 is a circuit diagram of a part of a conventional synchronous dynamic random access memory (synchronous DRAM)
Figure 2:
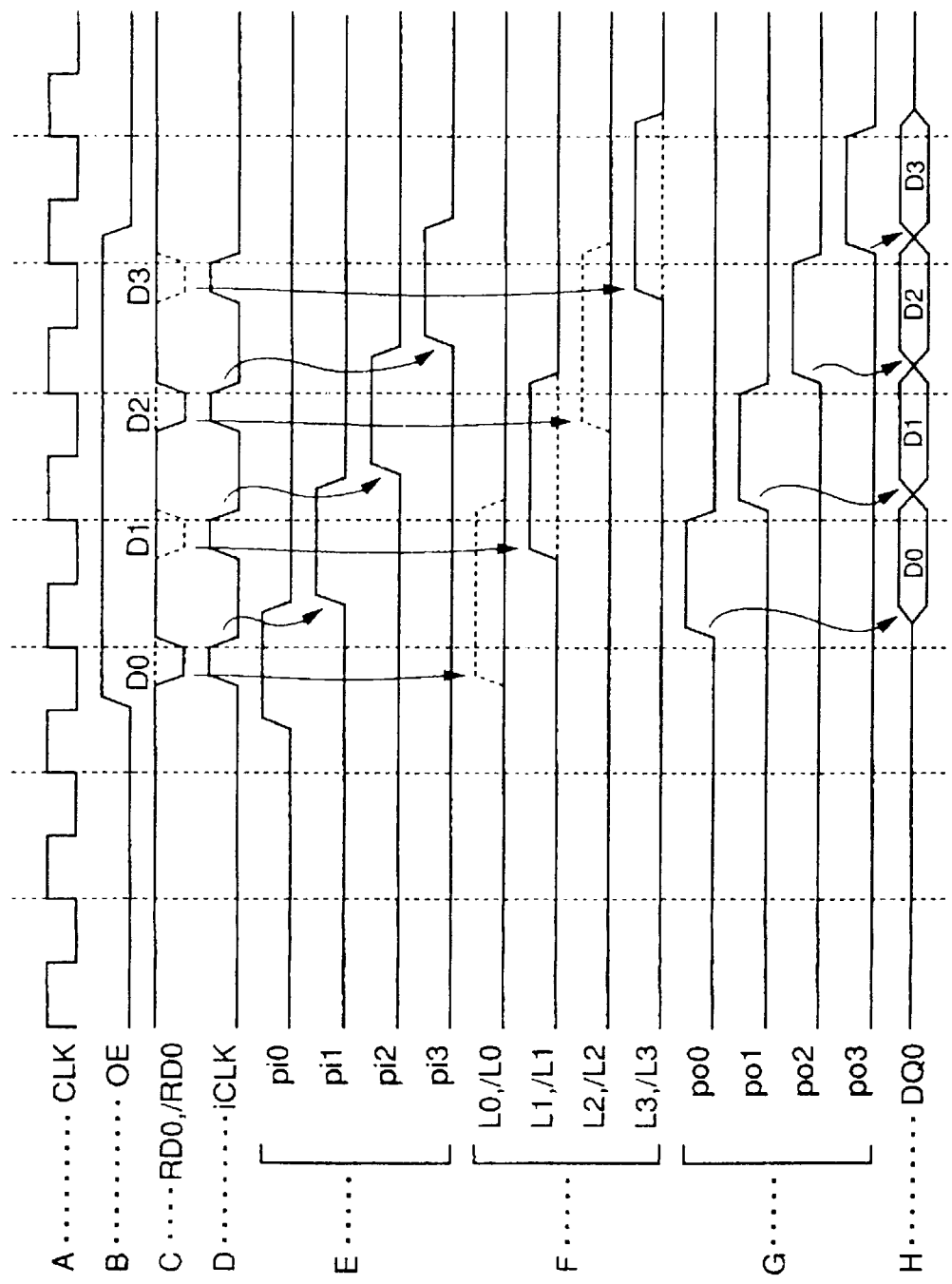
FIG. 2 is a timing chart of the synchronous DRAM shown in FIG. 1 when the burst length is set to 4.
Figure 3:
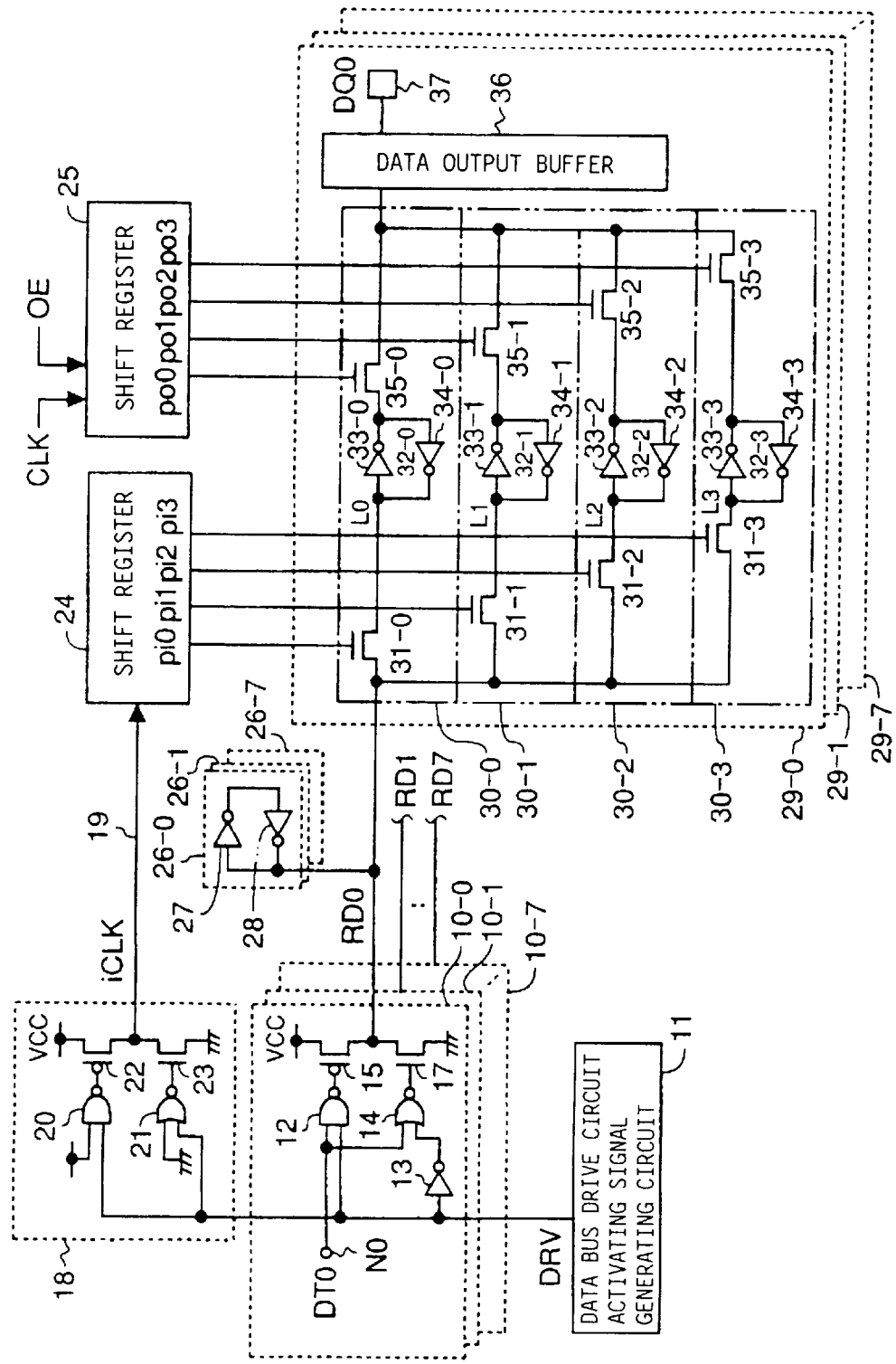
FIG. 3 is a circuit diagram of a part of a synchronous DRAM according to a first embodiment of the present invention.

A description will now be given, with reference to FIGS. 3 and 4, of a first embodiment of the present invention. FIG. 3 is a circuit diagram of a part of a synchronous DRAM according to the first embodiment of the present invention. The synchronous DRAM shown in FIG. 3 has an 8-bit structure.

In FIG. 3, data bus drive circuits 10-0, 10-1 . . . . 10-7 are provided for each bit of 8-bit read data DT0, DT1, . . . , DT7 output from a memory core part (not shown in the figure). Data buses RD0, RD1, . . . , RD7 are driven by the data bus drive circuits 10-0, 10-1, . . . , 10-7, respectively. The read data DT0, DT1, . . . , DT7 output from the memory core part is transmitted to an output circuit part via the data buses RD0, RD1, . . . , RD7 each of which comprises a single line.

Data bus drive circuit activating signal generating circuit 11 controls activation and deactivation of the data bus drive circuits 10-0, 10-1, . . . 10-7 in accordance with a data bus drive circuit activating signal DRV. Each of the data bus drive circuits 10-0, 10-1, . . . , 10-7 has the same circuit structure. The read data DT0 output from the memory core part is provided to a node NO in the data bus drive circuit 10-0.

A NAND circuit 12 performs a NAND operation with respect to the read data DT0 and the data bus drive circuit activating signal DRV. An inverter 13 inverts the data bus drive circuit activating signal DRV. A NOR circuit performs a NOR operation with respect to the read data DT0 and an output of the inverter 13.

A pMOS (i.e., p-channel metal oxide semiconductor) transistor 15 is controlled by an output of the NAND circuit 12 to be conductive (turned on) or non-conductive (turned off). A source of the pMOS transistor 15 is connected to a VCC power line. A drain of the pMOS transistor 15 is connected to the data bus RD0. A gate of the pMOS transistor 15 is connected to an output terminal of the NAND circuit 12.

An nMOS (i.e., n-channel metal oxide semiconductor) transistor 17 is controlled by an output of the NOR circuit 14 to be conductive (turned on) or non-conductive (turned off. A source of the nMOS transistor 17 is connected to a ground line. A drain of the nMOS transistor 17 is connected to the data bus RD0. A gate of the nMOS transistor 17 is connected to an output terminal of the NOR circuit 14.

In the data bus drive circuit 10-0, when the data bus drive circuit activating signal DRV is at a low level (L-level), the output of the NAND circuit 12 is at a high level (H-level), the pMOS transistor 15 is turned off, the output of the inverter 13 is at a high level (H-level), the output of the NOR circuit 14 is at a low level (L-level), and the nMOS transistor 17 is turned off. Thus, the output terminal of the data bus drive circuit 10-0 is at a high impedance state.

On the other hand, when the data bus drive circuit activating signal DRV is at a high level (H-level), the NAND circuit 12 functions as an inverter with respect to the read data DT0, and an output of the inverter 13 is changed to the L-level. Thus, the NOR circuit 14 also functions as an inverter with respect to the read data DT0. When the read data DT0 is at the H-level, the output of the NAND circuit 12 is at the L-level, the pMOS transistor 15 is turned on, the output of the NOR circuit 14 Is at the L-level, and the nMOS transistor 17 is turned off. Thus, the data bus RD0 is at the H-level. On the other hand, when the read data DT0 is at the H-level, the output of the NAND circuit 12 is at the H-level, the pMOS transistor 15 is turned off, the output of the NOR circuit 14 is at the H-level, and the nMOS transistor 17 is turned on. Thus, the data bus RD0 is at the L-level.

A data bus status shift monitoring signal generating circuit 18 generates a data bus status shift monitoring signal iCLK indicating a shift of the status of the data buses D0, D1, ..., D7 in accordance with the data bus drive circuit activating signal DRV. The data bus status shift monitoring signal iCLK is transmitted to a shift register via a data bus status shift monitoring signal line 19.

The data bus status shift monitoring signal generating circuit 18 comprises a NAND circuit 20, a NOR circuit 21, a pMOS transistor 22 and an nMOS transistor 23. One input terminal of the NAND circuit 20 is connected to a VCC power line, and the other input terminal is connected to the data bus drive circuit activating signal generating circuit 11 so that the data bus drive circuit activating signal DRV is input thereto. One input terminal of the NOR circuit 20 is connected to a ground line, and the other input terminal is connected to the data bus drive circuit activating signal generating circuit 11 so that the data bus drive circuit activating signal DRV is input thereto.

The pMOS transistor 22 is controlled by an output of the NAND circuit 20 to be conductive (turned on) or non-conductive (turned off). A source of the pMOS transistor 22 is connected to a VCC power line. A drain of the PMOS transistor 22 is connected to the data bus status shift monitoring line 19. A gate of the pMOS transistor 22 is connected to an output terminal of the NAND circuit 20.

The nMOS transistor 23 is controlled by an output of the NOR circuit 21 to be conductive (turned on) or non-conductive (turned off). A source of the nMOS transistor 23 is connected to a ground line. A drain of the nMOS transistor 23 is connected to the data bus status shift monitoring line 19. A gate of the nMOS transistor 23 is connected to an output terminal of the NOR circuit 21.

In the data bus status shift monitoring signal generating circuit 18, when the data bus drive circuit activating signal DRV is at the L-level, the output of the NAND circuit 20 is at the H-level, pMOS transistor 22 is turned off, the output of the NOR circuit 21 is at the H-level, and the nMOS transistor 23 is turned on. Thus, the data bus status shift monitoring signal iCLK is at the L-level.

On the other hand, when the data bus drive circuit activating signal DRV is at the H-level, the output of the NAND circuit 20 is at the L-level, pMOS transistor 22 is turned on, the output of the NOR circuit 21 is at the L-level, and the nMOS transistor 23 is turned off. Thus, the data bus status shift monitoring signal iCLK is at the H-level.

The shift register 24 turns an input pointer signal pi0 to the H-level a predetermined time period after a read command is input. For example, if a burst length is set to 4, the shift register 24 sequentially turns input pointer signals pi1, pi2 and pi3 to the H-level one by one by using the data bus status shift monitoring signal iCLK as a count-up clock.

A shift register 25 outputs output pointer signals po0, po1, po2 and po3 in accordance with an external clock signal CLK and an output enable signal OE which controls the output of data. If the burst length is set to 4, the shift register 25 sequentially turns the output pointer signals po0, po1, po2 and po3 to the H-level one by one each time the external clock signal CLK is raised when the output enable signal OE is at the H-level.

Data bus potential holding circuits 26-0, 26-1, ..., 26-7 are provided to hold the data buses RD0, RD1, ..., RD7 at a potential provided by the data bus drive circuits 10-0,10-1, ..., 10-7, respectively. Each of the data bus potential holding circuits 26-0, 26-1, ..., 26-7 has the same circuit structure. For example, the data bus potential holding circuit 25-0 comprises inverters 27 and 28 cross-connected to each other. An output terminal of the inverter 28 and the input terminal of the inverter 27 are connected to the data bus RD0.

The data buses RD0, RD1, ..., are connected to output circuit parts 29-0, 29-1, ..., 29-7, respectively. Each of the output circuit parts 29-0, 29-1, ..., 29-7 has the same circuit structure. For example, the output circuit part 29-0 comprises data latch circuits 30-0, 30-1, 30-2 and 30-3, a data output buffer 36 and a pad 37. Each of the data latch circuits 30-0, 30-1, 30-2 and 30-3 latches the read data DT0 on the data bus RD0.

In the present embodiment, a data input control circuit is constituted by the data bus status shift monitoring circuit 18 and the shift register 24 so as to control input operations of the data latch circuits 30-0, 30-1, 30-2 and 30-3. The shift register 25 serves as an output control circuit which controls output operations of the data latch circuits 30-0, 30-1, 30-2 and 30-3.

The data latch circuit 30-0 comprises an nMOS transistor 31-0, a latch circuit 32-0 and an nMOS transistor 35-0. A drain of the nMOS transistor 31-0 is connected to the data bus RD0. The nMOS transistor 31-0 is controlled to be turned on or off by the input pointer signal pi0 input from the shift register 24. The latch circuit 32-0 includes inverters 33-0 and 34-0. An output terminal of the inverter 34-0 and an input terminal of the inverter 33-0 are connected to a source of the nMOS transistor 31-0. A drain of the nMOS transistor 35-0 is connected to an output terminal of the inverter 33-0 and an input terminal of the inverter 34-0. The nMOS transistor 35-0 is controlled to be turned on or off by the output pointer signal po0.

In the data latch circuit 30-0, when the input pointer signal pi0 is at the H-level, the nMOS transistor 31-0 is turned on. Thus, the latch circuit 32-0 latches the read data DT0 on the data bus RD0. Thereafter, when the output pointer signal po0 is changed to the H-level, the data latch circuit 30-0 outputs inverted latched read data DT0.

The data latch circuit 30-1 comprises an nMOS transistor 31-1, a latch circuit 32-1 and an nMOS transistor 35-1. A drain of the nMOS transistor 31-1 is connected to the data bus RD0. The nMOS transistor 31-1 is controlled to be turned on or off by the input pointer signal pi1 input from the shift register 24. The latch circuit 32-1 includes inverters 33-1 and 34-1. An output terminal of the inverter 34-1 and an input terminal of the inverter 33-1 are connected to a source of the nMOS transistor 31-1. A drain of the nMOS transistor 35-1 is connected to an output terminal of the inverter 33-1 and an input terminal of the inverter 34-1. The nMOS transistor 35-1 is controlled to be turned on or off by the output pointer signal po1.

In the data latch circuit 30-1, when the input pointer signal pi1 is at the H-level, the nMOS transistor 31-1 is turned on. Thus, the latch circuit 32-1 latches the read data DT0 on the data bus RD0. Thereafter, when the output pointer signal po1 is changed to the H-level, the data latch circuit 30-1 outputs inverted latched read data DT0.

The data latch circuit 30-2 comprises an nMOS transistor 31-2, a latch circuit 32-2 and an nMOS transistor 35-2. A drain of the nMOS transistor 31-2 is connected to the data bus RD0. The nMOS transistor 31-2 is controlled to be turned on or off by the input pointer signal pi2 input from the shift register 24. The latch circuit 32-2 includes inverters 33-2 and 34-2. An output terminal of the inverter 34-2 and an input terminal of the inverter 33-2 are connected to a source of the nMOS transistor 31-2. A drain of the nMOS transistor 35-2 is connected to an output terminal of the inverter 33-2 and an input terminal of the inverter 34-2. The nMOS transistor 35-2 is controlled to be turned on or off by the output pointer signal po2.

In the data latch circuit 30-2, when the input pointer signal pi2 is at the H-level, the nMOS transistor 31-2 is turned on. Thus, the latch circuit 32-2 latches the read data DT0 on the data bus RD0. Thereafter, when the output pointer signal po2 is changed to the H-level, the data latch circuit 30-2 outputs inverted latched read data DT0.

The data latch circuit 30-3 comprises an nMOS transistor 31-3, a latch circuit 32-3 and an nMOS transistor 35-3. A drain of the nMOS transistor 31-1 is connected to the data bus RD0. The nMOS transistor 31-3 is controlled to be turned on or off by the input pointer signal pi3 input from the shift register 24. The latch circuit 32-3 includes inverters 33-3 and 34-3. An output terminal of the inverter 34-3 and an input terminal of the inverter 33-3 are connected to a source of the nMOS transistor 31-3. A drain of the nMOS transistor 35-3 is connected to an output terminal of the inverter 33-3 and an input terminal of the inverter 34-3. The nMOS transistor 35-3 is controlled to be turned on or off by the output pointer signal po3.

In the data latch circuit 30-3, when the input pointer signal pi3 is at the H-level, the nMOS transistor 31-3 is turned on. Thus, the latch circuit 32-3 latches the read data DT0 on the data bus RD0. Thereafter, when the output pointer signal po3 is changed to the H-level, the data latch circuit 30-3 outputs inverted latched read data DT0.

The data output buffer inputs the data output from the data latch circuits 30-0, 30-1, 30-2 and 30-3, and outputs the output data DQ0 to the pad 37.

Figure 4:
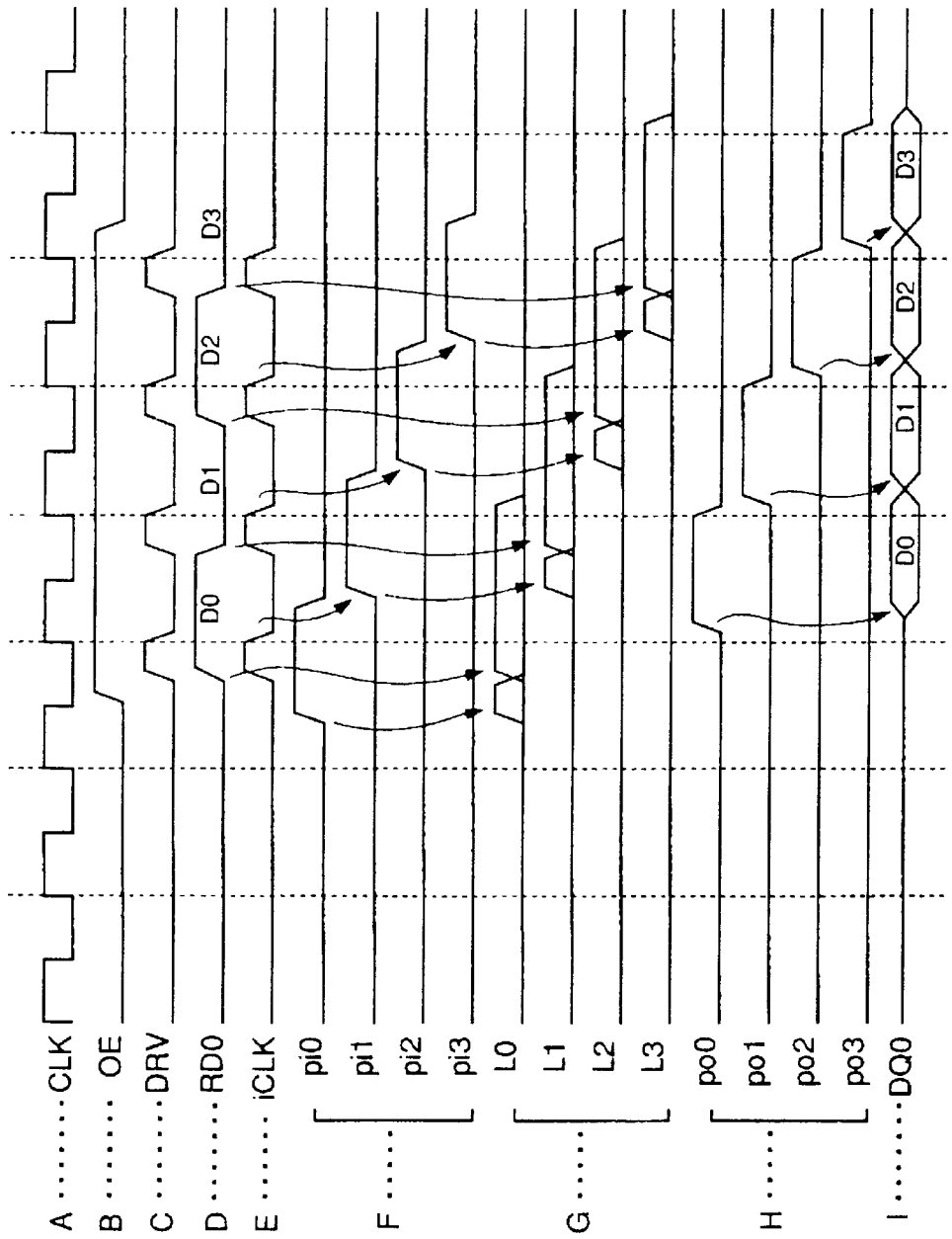
FIG. 4 is a timing chart of an operation of the synchronous DRAM shown in FIG. 3.

FIG. 4 is a timing chart of the synchronous DRAM shown in FIG. 3 when the burst length is set to 4. Waveform A in FIG. 4 indicates the external clock signal CLK. Waveform B in FIG. 4 indicates the output enable signal OE. Waveform C in FIG. 4 indicates the data bus drive circuit activating signal DRV. Waveform D in FIG. 4 indicates a potential of the data bus RD0. Waveform E in FIG. 4 indicates the data bus status shift monitoring signal iCLK. Waveform F in FIG. 4 indicates the input pointer signals pi0, pi1, pi2 and pi3. Waveform G in FIG. 4 indicates a potential of nodes L0, L1, L2, and L3 of the data latch circuits 30-0, 30-1, 30-2 and 30-3. Waveform H in FIG. 4 indicates output pointer signals po0, po1, po2 and po3. Waveform I in FIG. 4 indicates the output data DQ0 output to the pad 37.

In the above-mentioned first embodiment of the present invention, when a read command is input, the input pointer signal pi0 is changed to the H-level. It should be noted the data bus drive circuit activating signal DRV is at the L-level and the data buses RD0, RD1, . . . , RD7 are at the L-level before the data is read from the memory core part 1.

The read data DT0, DT1, . . . , DT7 are provided to the data bus drive circuits 10-0, 10-1, . . . , 10-7. In FIG. 4, the read data includes four data D0, D1, D2 and D3, and the four data are consecutively output to the data bus drive circuit 10-0. The data D0 is "logic 1=H-level", the data D1 is "logic 0=L-level", the data D2 is "logic 1=H-level", and the data D3 is "logic 0=L-level".

Since the burst length is set to 4, the data bus drive circuit activating signal DRV shifts four times, as shown by waveform C in FIG. 4, from the L-level to the H-level in synchronization with the external clock signal CLK when the data bus is driven. As a result, as shown by waveform D in FIG. 4, during the first data transmission cycle, the potential of the data bus RD0 is changed to the H-level by the data bus drive circuit 10-0. The potential is maintained unchanged by the data bus potential holding circuit 26-0 until the next transmission cycle. During the second data transmission cycle, the potential of the data bus RD0 is changed to the L-level by the data bus drive circuit 10-0. The potential is maintained unchanged by the data bus potential holding circuit 26-0 until the next transmission cycle. Additionally, during the third data transmission cycle, the potential of the data bus RD0 is changed to the H-level by the data bus drive circuit 10-0. The potential is maintained unchanged by the data bus potential holding circuit 26-0 until the next transmission cycle. Further, during the fourth data transmission cycle, the potential of the data bus RD0 is changed to the L-level by the data bus drive circuit 10-0. The potential is maintained unchanged by the data bus potential holding circuit 26-0 until the next transmission cycle.

On the other hand, when the data bus drive circuit activating signal DRV changes as shown by waveform C in FIG. 4, the input pointer signals pi0, pi1, pi2 and pi3 change correspondingly as shown by waveform F in FIG. 4. As a result, the data D0, D1, D2 and D3 sequentially output to the data bus RD0 are sequentially latched by the respective data latch circuits 30-0, 30-1, 30-2 and 30-3.

In the present embodiment, since the rise time of the input pointer signals pi0, pi1, pi2 and pi3 precedes the rise time of the data bus status shift monitoring signal iCLK, the data of the previous cycle is input to the data latch circuits 30-0, 30-1, 30-2 and 30-3. However, since the appropriate data D0, D1, D2 and D3 are input after the input of the data of the previous cycle, no problem occurs in the operation.

On the other hand, when a read command is input, the output enable signal OE is changed to the H-level as shown by waveform B in FIG. 4. Thus, the shift register 25 is changed to an active state. Thereby, as shown by waveform H in FIG. 4, the output pointer signals po0, po1, po2 and po3 are changed to the H-level sequentially one by one each time the external clock signal CLK rises. As a result, the data D0, D1, D2 and D3 sequentially latched by the data latch circuits 30-0, 30-1, 30-2 and 30-3 are sequentially transmitted to the data output buffer 36. Thus, the data D0, D1, D2 and D3 are sequentially output as the output data DQ0 to the pad 37.

As mentioned above, according to the present embodiment, a wave pipeline operation is achieved by providing to the output circuit part 29-n (n=0, 1, 2, . . . , 7) the data latch circuits 30-0, 30-1, 30-2 and 30-3 which sequentially latch the data consecutively transmitted through the data bus RDn (n=0, 1, 2, . . . 7).

Additionally, since the single line data buses RD0, RD1, . . . , RD7 are provided as a data bus for transmitting the read data DT0, DT1, . . . , DT7, there is no need to precharge the data buses RD0, RD1, . . . , RD7 from each data transmission cycle. Thus, the status of the data buses RD0, RD1, . . . , RD7 changes once during a single clock cycle time.

Accordingly, the frequency of activation of the data buses can be set to substantially one half of that of the conventional synchronous DRAM, and, thereby, the current for charging the data buses RD0, RD1, . . . , RD7 can be reduced to one half. Thus, power consumption of the synchronous DRAM according to the present embodiment is decreased.

Additionally, in the output circuit parts 29-n (n=0, 1, 2, ..., 7), a timing of latching of the data latch circuits 30-0, 30-1, 30-2 and 30-3 can be easily controlled since the data bus status shift monitoring signal generating circuit 18 is provided to generate the data bus status shift monitoring signal iCLK and the shift register 24 is provided which inputs the data bus status shift monitoring signal iCLK and outputs the input pointer signals pi0, pi1, pi2 and pi3.

Additionally, in the present embodiment, the data bus potential holding circuits 26-0, 26-1, ..., 26-7 are provided to hold the data buses RD0, RD1, ..., RD7 at the potential provided by the data bus drive circuits 10-0, 10-1, ..., 10-7. Thus, a structure which does not require a precharge of the data buses for each clock cycle can be achieved by a simple circuit structure.

Figure 5:
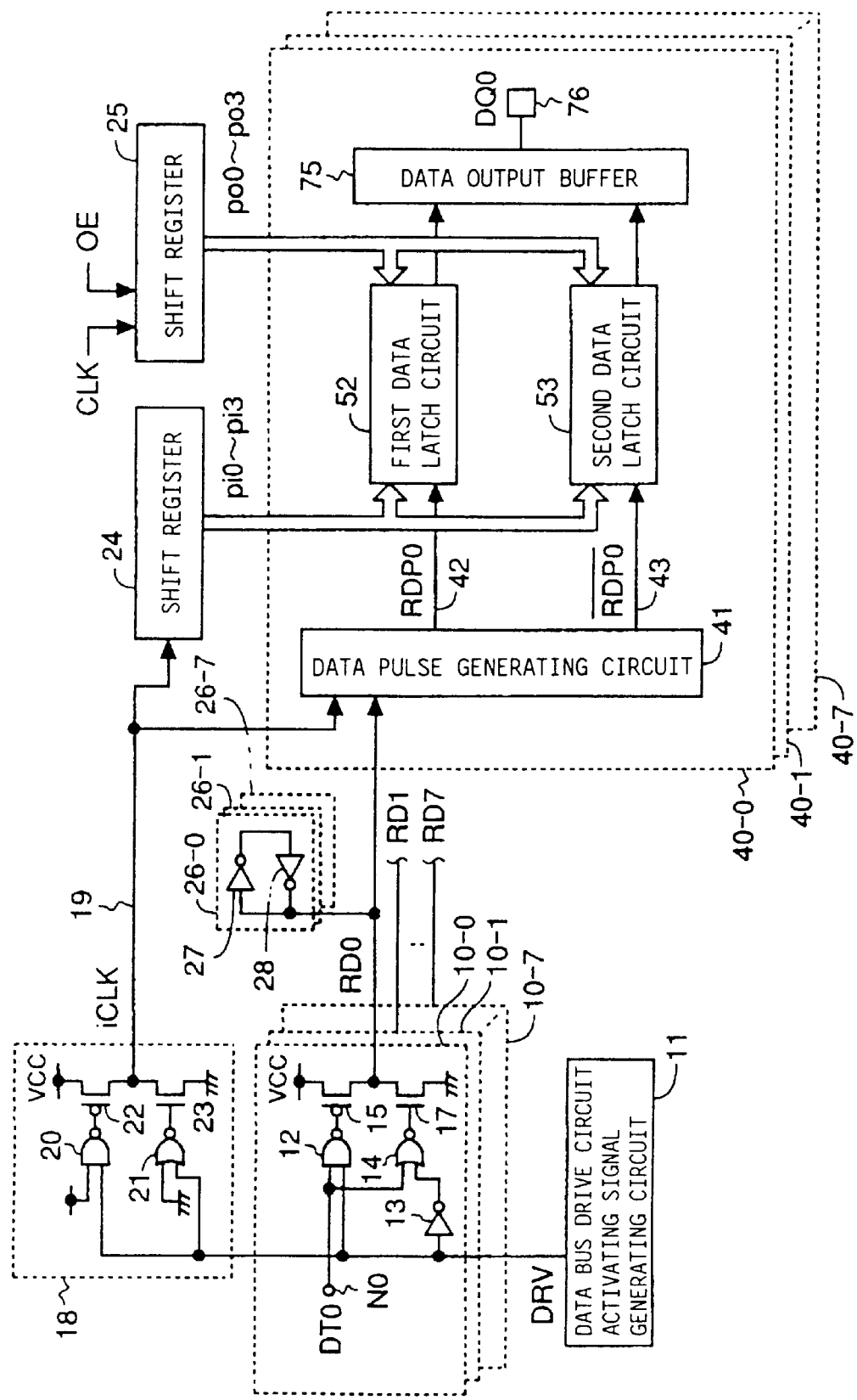
FIG. 5 is a circuit diagram of a part of a semiconductor memory device according to a second embodiment of the present invention.

A description will now be given, with reference to FIGS. 5 to 9, of a second embodiment of the present invention. FIG. 5 is circuit diagram of a part of a synchronous DRAM according to the second embodiment of the present invention. In FIG. 5, parts that are the same as the parts shown in FIG. 3 are given the same reference numerals, and descriptions thereof will be omitted. The synchronous DRAM shown in FIG. 5 has the same structure with the synchronous DRAM according to the first embodiment of the present invention shown in FIG. 3 except for the output circuit parts 29-0, 29-1, ..., 29-7 being replaced by output circuit parts 40-0, 40-1, ..., 40-7.

Each of the output circuit parts 40-0, 40-1, ..., 40-7 has the same circuit structure. Thus, for the sake of simplification, a description will be given of the output circuit part 40-0 as a representative of other output circuit parts 40-1, 40-2, ..., 40-7. The output circuit 40-0 comprises a data pulse generating circuit 41, data pulse lines 42 and 43, a first data latch circuit part 52, a second data latch circuit part 53, a data output buffer 75 and a pad 76.

The data pulse generating circuit 41 generates data pulses RDP0 and /RDP0 from the read data DT0 which is transmitted through the data bus RD0. The data pulses RDP0 and /RDP0 are complementary to each other, and are synchronous with the data bus status shift monitoring signal iCLK. The data pulse RDP0 is output to the data pulse line 42, and the data pulse /RDP0 is output to the data pulse line 43.

Figure 6:
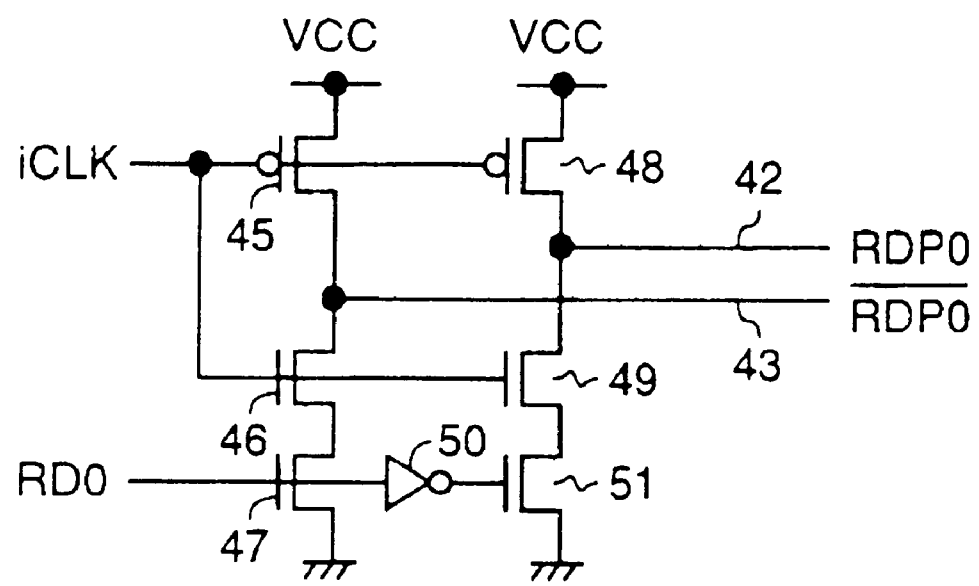
FIG. 6 is a circuit diagram of a data pulse generating circuit shown in FIG. 5.

FIG. 6 is a circuit diagram of the data pulse generating circuit 41. The data pulse generating circuit comprises pMOS transistors 45 and 48, nMOS transistors 46, 47, 49 and 51 and an inverter 50.

The pMOS transistor 45 is controlled to be turned on or off by the data bus status shift monitoring signal iCLK. A source of the pMOS transistor 45 is connected to the VCC power source. A drain of the pMOS transistor 45 is connected to the data pulse line 43. The nMOS transistor 46 is controlled to be turned on or off by the data bus status shift monitoring signal iCLK. A drain of the nMOS transistor 46 is connected to the data pulse line 43. The nMOS transistor 47 is controlled to be turned on or off by a potential of the data bus RD0. A drain of the nMOS transistor 47 is connected to the source of the nMOS transistor 46. A source of the nMOS transistor 47 is connected to the ground line. The pMOS transistor 48 is controlled to be turned on or off by the data bus status shift monitoring signal iCLK. A source of the pMOS transistor 48 is connected to the VCC line. A drain of the pMOS transistor 48 is connected to the data pulse line 42. The nMOS transistor 49 is controlled to be turned on or off by the data bus status shift monitoring signal iCLK. A drain of the nMOS transistor 49 is connected to the data pulse line 42. The inverter 50 inverts the data transmitted through the data bus RD0. The nMOS transistor 51 is controlled to be turned on or off by an output of the inverter 50. A drain of the nMOS transistor 51 is connected to the source of the nMOS transistor 49. A source of the nMOS transistor 51 is connected to the ground line.

In the data pulse generating circuit 41, when the data bus status shift monitoring signal iCLK is at the L-level, the pMOS transistor 45 is turned on, the pMOS transistor 48 is turned on, and the nMOS transistors 46 and 49 are turned off. Thus, the data pulse RDP is changed to the H-level and the data pulse /RDP0 is changed to the H-level.

On the other hand, when the data bus status shift monitoring signal iCLK is at the H-level, the pMOS transistor 45 is turned off, the pMOS transistor 48 is turned off, the nMOS transistor 46 is turned on, and the nMOS transistor 49 is turned on. As a result, when the potential of the data bus RD0 is at the H-level, the nMOS transistor 51 is turned off, and the data pulse RDP0 is changed to the L-level.

In FIG. 5, the first data latch circuit part 52 latches the data pulse RDP0 output to the data pulse line 42 from the data pulse generating circuit 42. The second data latch circuit part 53 latches the data pulse /RDP0 output to the data pulse line 43 from the data pulse generating circuit 41.

It should noted that, in this embodiment, the data bus status shift monitoring signal generating circuit 18 and the shift register 24 together constitute a data input control circuit with respect to the first and second data latch circuit parts 52 and 53. Additionally, the shift register 25 serves as a data output control circuit with respect to the first and second data output control circuit parts 52 and 53.

Figure 7:
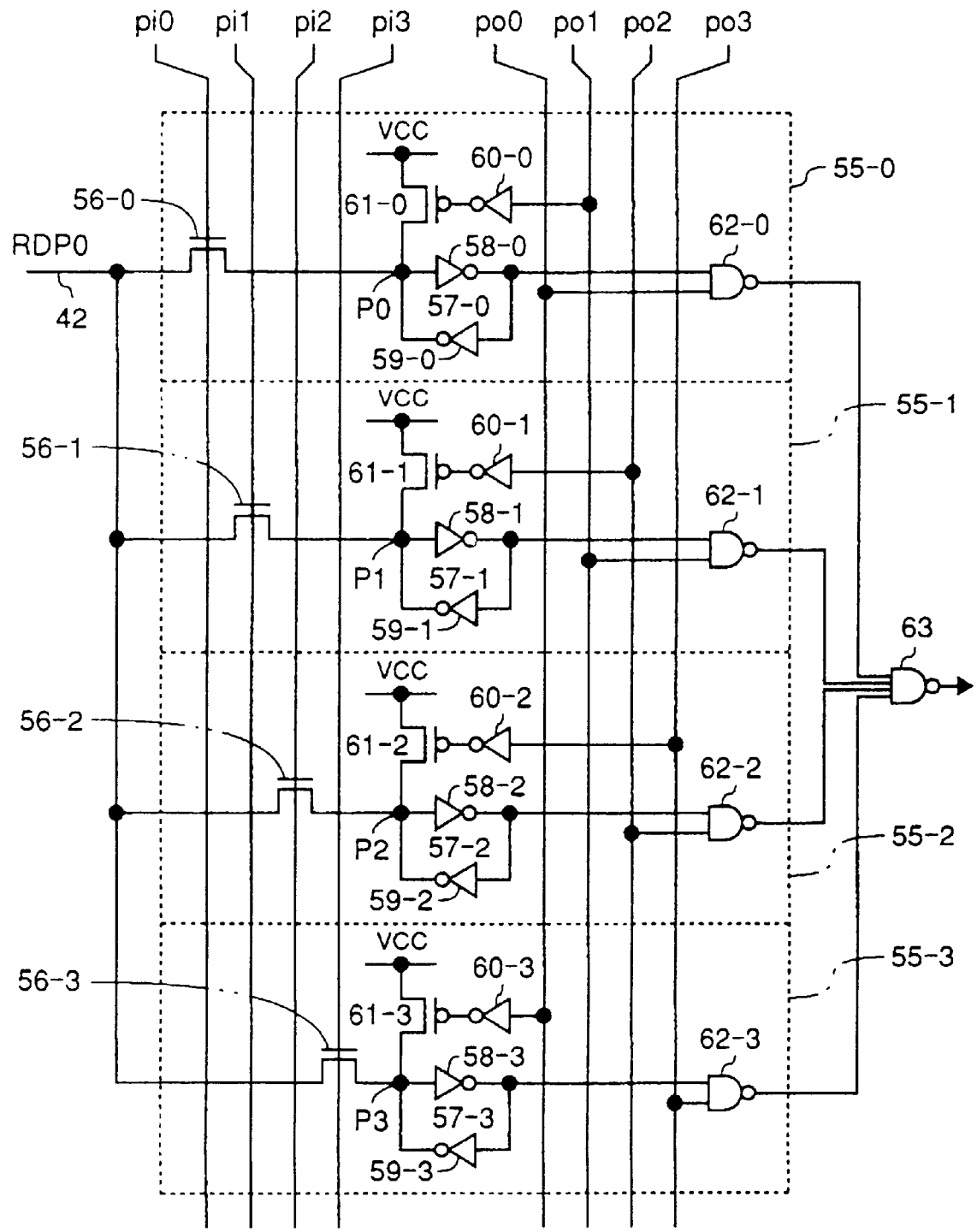
FIG. 7 is a circuit diagram of a first data latch circuit shown in FIG. 5.

FIG. 7 is a circuit diagram of the first data latch circuit part 52. In FIG. 7, circuits encircled by dotted lines indicated by reference numerals 55-0, 55-1, 55-2 and 55-3 correspond to data latch circuits which latch the data pulse RDP0 on the data pulse line 42.

The data latch circuit 55-0 comprises an nMOS transistor 56-0, a latch circuit 57-0, an inverter 60-0, a pMOS transistor 61-0 and a NAND circuit 62-0.

In the data latch circuit 55-0, the nMOS transistor 56-0 is controlled to be turned on or off by the input pointer signal pi0. A drain of the nMOS transistor 56-0 is connected to the data pulse line 42. The latch circuit 57-0 comprises inverters 58-0 and 59-0. An output terminal of the inverter 59-0 and an input terminal of the inverter 58-0 are connected to the source of the nMOS transistor 56-0. The inverter 60-0 inverts the output pointer signal po1. The pMOS transistor 61-0 is controlled to be turned on or off by the output of the inverter 60-0. A source of the pMOS transistor 61-0 is connected to the VCC power source. A drain of the pMOS transistor 61-0 is connected to the input terminal of the inverter 58-0. The NAND circuit 62-0 performs a NAND operation with respect to the output of the inverter 58-0 and the output pointer signal po0.

In the data latch circuit 55-0, when the output pointer signal po0 is at the L-level, the output of the NAND circuit 62-0 is changed to the H-level. The nMOS transistor 56-0 is turned on when the input pointer signal pi0 is changed to the H-level in a state where the output pointer signal po1 is at the L-level, the output of the inverter 60-0 is at the H-level and the pMOS transistor 61-0 is turned off. Thereby, the latch circuit 57-0 latches the data pulse RDP0.

Thereafter, the NAND circuit 62-0 outputs the data which is obtained by inverting the output of the inverter 58-0, that is, the latched data of the latch circuit 57-0 when the output pointer signal po0 is changed to the H-level in a state where the output pointer signal po1 is maintained at the L-level, the output of the inverter 60-0 is maintained at the H-level and the pMOS transistor 61-0 is maintained to be turned off.

Thereafter, when the output pointer signal po1 is changed to the H-level, the output of the inverter 60-0 is changed to the L-level, the pMOS transistor 61-0 is turned on and the level of a node P0 is changed to the H-level. Thus, the latch circuit 57-0 latches the H-level, and the output of the inverter 58-0 is at the L-level and the output of the NAND circuit 62-0 is at the H-level.

The data latch circuit 55-1 comprises an nMOS transistor 56-1, a latch circuit 57-1, an inverter 60-1, a pMOS transistor 61-1 and a NAND circuit 62-1.

In the data latch circuit 55-1, the nMOS transistor 56-1 is controlled to be turned on or off by the input pointer signal pi1. A drain of the nMOS transistor 56-1 is connected to the data pulse line 42. The latch circuit 57-1 comprises inverters 58-1 and 59-1. An output terminal of the inverter 59-1 and an input terminal of the inverter 58-1 are connected to the source of the nMOS transistor 56-1. The inverter 60-1 inverts the output pointer signal po2. The pMOS transistor 61-1 is controlled to be turned on or off by the output of the inverter 60-1. A source of the pMOS transistor 61-1 is connected to the VCC power source. A drain of the pMOS transistor 61-1 is connected to the input terminal of the inverter 58-1. The NAND circuit 62-1 performs a NAND operation with respect to the output of the inverter 58-1 and the output pointer signal po1.

In the data latch circuit 55-1, when the output pointer signal po1 is at the L-level, the output of the NAND circuit 62-1 is changed to the H-level. The nMOS transistor 56-1 is turned on when the input pointer signal pi1 is changed to the H-level in a state where the output pointer signal po2 is at the L-level, the output of the inverter 60-1 is at the H-level and the pMOS transistor 61-1 is turned off. Thereby, the latch circuit 57-1 latches the data pulse RDP0.

Thereafter, the NAND circuit 62-1 outputs the data which is obtained by inverting the output of the inverter 58-1, that is, the latched data of the latch circuit 57-1 when the output pointer signal po1 is changed to the H-level in a state where the output pointer signal po2 is maintained at the L-level, the output of the inverter 60-1 is maintained at the H-level and the pMOS transistor 61-1 is maintained to be turned off.

Thereafter, when the output pointer signal po2 is changed to the H-level, the output of the inverter 60-1 is changed to the L-level, the pMOS transistor 61-1 is turned on and the level of a node P1 is changed to the H-level. Thus, the latch circuit 57-1 latches the H-level, and the output of the inverter 58-1 is at the L-level and the output of the NAND circuit 62-1 is at the H-level.

The data latch circuit 55-2 comprises an nMOS transistor 56-2, a latch circuit 57-2, an inverter 60-2, a pMOS transistor 61-2 and a NAND circuit 62-2.

In the data latch circuit 55-2, the nMOS transistor 56-2 is controlled to be turned on or off by the input pointer signal pi2. A drain of the nMOS transistor 56-2 is connected to the data pulse line 42. The latch circuit 57-2 comprises inverters 58-2 and 59-2. An output terminal of the inverter 59-2 and an input terminal of the inverter 58-2 are connected to the source of the nMOS transistor 56-2. The inverter 60-2 inverts the output pointer signal po3. The pMOS transistor 61-2 is controlled to be turned on or off by the output of the inverter 60-2. A source of the pMOS transistor 61-2 is connected to the VCC power source. A drain of the PMOS transistor 61-2 is connected to the input terminal of the inverter 58-2. The NAND circuit 62-2 performs a NAND operation with respect to the output of the inverter 58-2 and the output pointer signal po2.

In the data latch circuit 55-2, when the output pointer signal po2 is at the L-level, the output of the NAND circuit 62-2 is at the H-level. The nMOS transistor 56-2 is turned on when the input pointer signal pi2 is at the H-level in a state where the output pointer signal po3 is at the L-level, the output of the inverter 60-2 is at the H-level and the pMOS transistor 61-2 is turned off. Thereby, the latch circuit 57-2 latches the data pulse RDP0.

Thereafter, the NAND circuit 62-2 outputs the data which is obtained by inverting the output of the inverter 58-2, that is, the latched data of the latch circuit 57-2 when the output pointer signal po2 is at the H-level in a state where the output pointer signal po3 is maintained at the L-level, the output of the inverter 60-2 is maintained at the H-level and the pMOS transistor 61-2 is maintained to be turned off.

Thereafter, when the output pointer signal po3 is at the H-level, the output of the inverter 60-2 is at the L-level, the pMOS transistor 61-2 is turned on and the level of a node P2 is at the H-level. Thus, the latch circuit 57-2 latches the H-level, and the output of the inverter 58-2 is at the L-level and the output of the NAND circuit 62-2 is at the H-level.

The data latch circuit 55-3 comprises an nMOS transistor 56-3, a latch circuit 57-3, an inverter 60-3, a pMOS transistor 61-3 and a NAND circuit 62-3.

In the data latch circuit 55-3, the nMOS transistor 56-3 is controlled to be turned on or off by the input pointer signal pi3. A drain of the nMOS transistor 56-3 is connected to the data pulse line 42. The latch circuit 57-3 comprises inverters 58-3 and 59-3. An output terminal of the inverter 59-3 and an input terminal of the inverter 58-3 are connected to the source of the nMOS transistor 56-3. The inverter 60-3 inverts the output pointer signal po0. The pMOS transistor 61-3 is controlled to be turned on or off by the output of the inverter 60-3. A source of the pMOS transistor 61-3 is connected to the VCC power source. A drain of the pMOS transistor 61-3 is connected to the input terminal of the inverter 58-3. The NAND circuit 62-3 performs a NAND operation with respect to the output of the inverter 58-3 and the output pointer signal po3.

In the data latch circuit 55-3, when the output pointer signal po3 is at the L-level, the output of the NAND circuit 62-3 is at the H-level. The nMOS transistor 56-3 is turned on when the input pointer signal pi3 is at the H-level in a state where the output pointer signal po0 is at the L-level, the output of the inverter 60-3 is at the H-level and the pMOS transistor 61-3 is turned off. Thereby, the latch circuit 57-3 latches the data pulse RDP0.

Thereafter, the NAND circuit 62-3 outputs the data which is obtained by inverting the output of the inverter 58-3, that is, the latched data of the latch circuit 57-3 when the output pointer signal po3 is at the H-level in a state where the output pointer signal po0 is maintained at the L-level, the output of the inverter 60-3 is maintained at the H-level and the pMOS transistor 61-3 is maintained to be turned off.

Thereafter, when the output pointer signal po0 is at the H-level, the output of the inverter 60-3 is at the L-level, the pMOS transistor 61-3 is turned on and the level of a node P3 is at the H-level. Thus, the latch circuit 57-3 latches the H-level, and the output of the inverter 58-3 is at the L-level and the output of the NAND circuit 62-3 is at the H-level.

The outputs of the NAND circuits 62-0, 62-1, 62-2 and 62-3 are subjected to a NAND operation performed by a NAND circuit 63.

Figure 8:
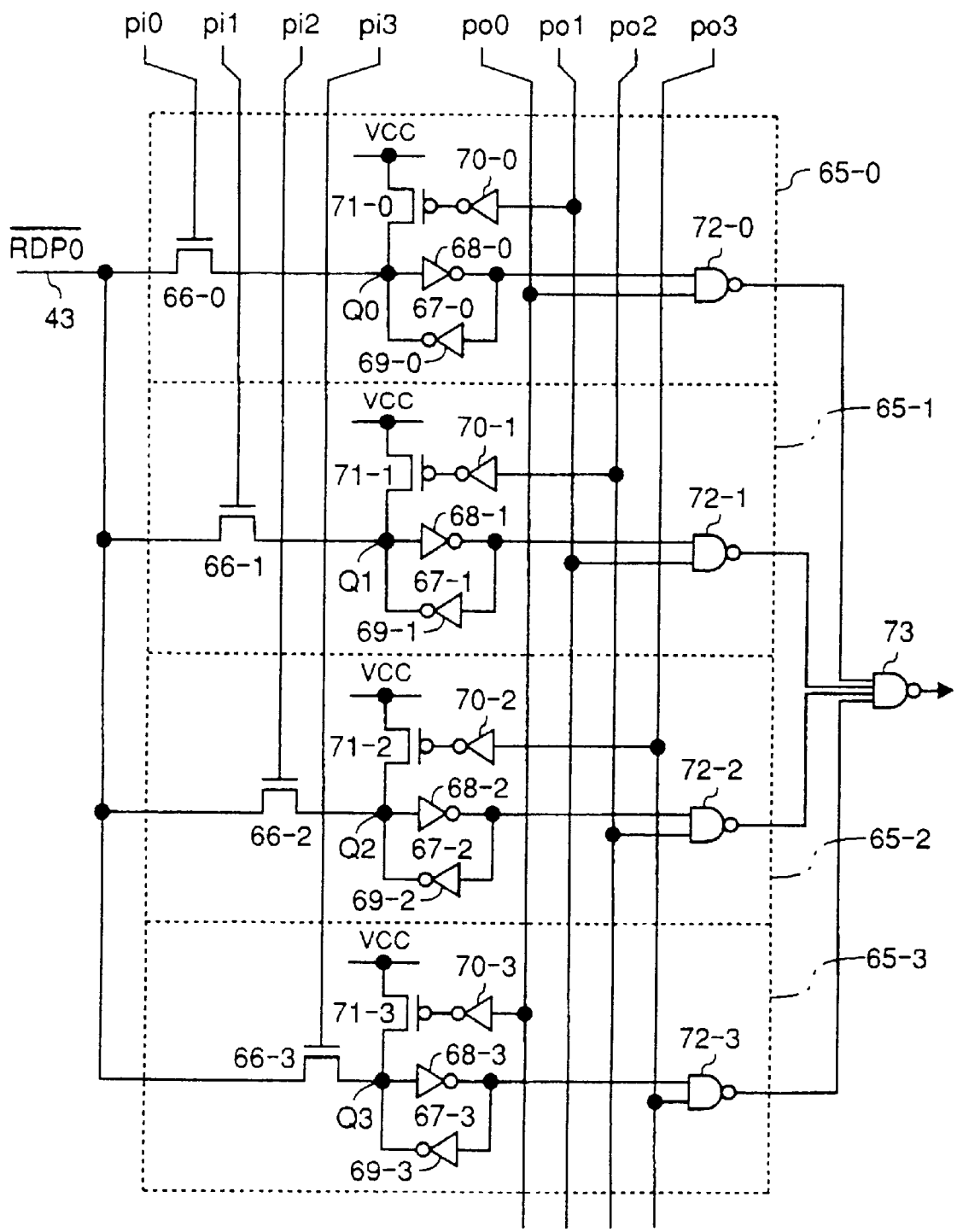
FIG. 8 is a circuit diagram of a second data latch circuit shown in FIG. 5.

FIG. 8 is a circuit diagram of the second data latch circuit part 53. In FIG. 8, circuits encircled by dotted lines indicated by reference numerals 65-0, 65-1, 65-2 and 65-3 correspond to data latch circuits which latch the data pulse /RDP0 on the data pulse line 43.

The data latch circuit 65-0 comprises an nMOS transistor 66-0, a latch circuit 67-0, an inverter 70-0, a pMOS transistor 71-0 and a NAND circuit 72-0.

In the data latch circuit 65-0, the nMOS transistor 66-0 is controlled to be turned on or off by the input pointer signal pi0. A drain of the nMOS transistor 66-0 is connected to the data pulse line 43. The latch circuit 67-0 comprises inverters 68-0 and 69-0. An output terminal of the inverter 69-0 and an input terminal of the inverter 68-0 are connected to the source of the nMOS transistor 66-0. The inverter 70-0 inverts the output pointer signal po1. The pMOS transistor 71-0 is controlled to be turned on or off by the output of the inverter 70-0. A source of the pMOS transistor 71-0 is connected to the VCC power source. A drain of the pMOS transistor 71-0 is connected to the input terminal of the inverter 68-0. The NAND circuit 72-0 performs a NAND operation with respect to the output of the inverter 68-0 and the output pointer signal po0.

In the data latch circuit 65-0, when the output pointer signal po0 is at the L-level, the output of the NAND circuit 72-0 is at the H-level. The nMOS transistor 66-0 is turned on when the input pointer signal pi0 is at the H-level in a state where the output pointer signal po1 is at the L-level, the output of the inverter 70-0 is at the H-level and the pMOS transistor 71-0 is turned off. Thereby, the latch circuit 67-0 latches the data pulse /RDP0.

Thereafter, the NAND circuit 72-0 outputs the data which is obtained by inverting the output of the inverter 68-0, that is, the latched data of the latch circuit 67-0 when the output pointer signal po0 is at the H-level in a state where the output pointer signal po1 is maintained at the L-level, the output of the inverter 70-0 is maintained at the H-level and the pMOS transistor 71-0 is maintained to be turned off.

Thereafter, when the output pointer signal po1 is at the H-level, the output of the inverter 70-0 is at the L-level, the PMOS transistor 71-0 is turned on and the level of a node Q0 is at the H-level. Thus, the latch circuit 67-0 latches the H-level, and the output of the inverter 68-0 is at the L-level and the output of the NAND circuit 72-0 is at the H-level.

The data latch circuit 65-1 comprises an nMOS transistor 66-1, a latch circuit 67-1, an inverter 70-1, a pMOS transistor 71-1 and a NAND circuit 72-1.

In the data latch circuit 65-1, the nMOS transistor 66-1 is controlled to be turned on or off by the input pointer signal pi1. A drain of the MOS transistor 66-1 is connected to the data pulse line 43. The latch circuit 67-1 comprises inverters 68-1 and 69-1. An output terminal of the inverter 69-1 and an input terminal of the inverter 68-1 are connected to the source of the nMOS transistor 66-1. The inverter 70-1 inverts the output pointer signal po2. The pMOS transistor 71-1 is controlled to be turned on or off by the output of the inverter 70-1. A source of the pMOS transistor 71-1 is connected to the VCC power source. A drain of the pMOS transistor 71-1 is connected to the input terminal of the inverter 68-1. The NAND circuit 72-1 performs a NAND operation with respect to the output of the inverter 68-1 and the output pointer signal po1.

In the data latch circuit 65-1, when the output pointer signal po1 is at the L-level, the output of the NAND circuit 72-1 is at the H-level. The nMOS transistor 66-1 is turned on when the input pointer signal pi1 is changed to the H-level in a state where the output pointer signal po2 is at the L-level, the output of the inverter 70-1 is at the H-level and the pMOS transistor 71-1 is turned off. Thereby, the latch circuit 67-1 latches the data pulse /RDP0.

Thereafter, the NAND circuit 72-1 outputs the data which is obtained by inverting the output of the inverter 68-1, that is, the latched data of the latch circuit 67-1 when the output pointer signal po1 is at the H-level in a state where the output pointer signal po2 is maintained at the L-level, the output of the inverter 70-1 is maintained at the H-level and the pMOS transistor 71-1 is maintained to be turned off.

Thereafter, when the output pointer signal po2 is at the H-level, the output of the inverter 70-1 is at the L-level, the pMOS transistor 71-1 is turned on and the level of a node Q1 is at the H-level. Thus, the latch circuit 67-1 latches the H-level, and the output of the inverter 68-1 is at the L-level and the output of the NAND circuit 72-1 is at the H-level.

The data latch circuit 65-2 comprises an nMOS transistor 66-2, a latch circuit 67-2, an inverter 70-2, a pMOS transistor 71-2 and a NAND circuit 72-2.

In the data latch circuit 65-2, the nMOS transistor 66-2 is controlled to be turned on or off by the input pointer signal pi2. A drain of the nMOS transistor 66-2 is connected to the data pulse line 43. The latch circuit 67-2 comprises inverters 68-2 and 69-2. An output terminal of the inverter 69-2 and an input terminal of the inverter 68-2 are connected to the source of the nMOS transistor 66-2. The inverter 70-2 inverts the output pointer signal po3. The pMOS transistor 71-2 is controlled to be turned on or off by the output of the inverter 70-2. A source of the pMOS transistor 71-2 is connected to the VCC power source. A drain of the pMOS transistor 71-2 is connected to the input terminal of the inverter 68-2. The NAND circuit 72-2 performs a NAND operation with respect to the output of the inverter 68-2 and the output pointer signal po2.

In the data latch circuit 65-2, when the output pointer signal po2 is at the L-level, the output of the NAND circuit 72-2 is at the H-level. The nMOS transistor 66-2 is turned on when the input pointer signal pi2 is at the H-level in a state where the output pointer signal po3 is at the L-level, the output of the inverter 70-2 is at the H-level and the pMOS transistor 71-2 is turned off. Thereby, the latch circuit 67-2 latches the data pulse /RDP0.

Thereafter, the NAND circuit 72-2 outputs the data which is obtained by inverting the output of the inverter 68-2, that is, the latched data of the latch circuit 67-2 when the output pointer signal po2 is at the H-level in a state where the output pointer signal po3 is maintained at the L-level, the output of the inverter 70-2 is maintained at the H-level and the pMOS transistor 71-2 is maintained to be turned off.

Thereafter, when the output pointer signal po3 is at the H-level, the output of the inverter 70-2 is at the L-level, the pMOS transistor 71-2 is turned on and the level of a node Q2 is at the H-level. Thus, the latch circuit 67-2 latches the H-level, and the output of the inverter 68-2 is at the L-level and the output of the NAND circuit 72-2 is at the H-level.

The data latch circuit 65-3 comprises an nMOS transistor 66-3, a latch circuit 67-3, an inverter 70-3, a pMOS transistor 71-3 and a NAND circuit 72-3.

In the data latch circuit 65-3, the nMOS transistor 66-3 is controlled to be turned on or off by the input pointer signal pi3. A drain of the nMOS transistor 66-3 is connected to the data pulse line 43. The latch circuit 67-3 comprises inverters 68-3 and 69-3. An output terminal of the inverter 69-3 and an input terminal of the inverter 68-3 are connected to the source of the nMOS transistor 66-3. The inverter 70-3 inverts the output pointer signal po0. The pMOS transistor 71-3 is controlled to be turned on or off by the output of the inverter 70-3. A source of the pMOS transistor 71-3 is connected to the VCC power source. A drain of the pMOS transistor 71-3 is connected to the input terminal of the inverter 68-3. The NAND circuit 72-3 performs a NAND operation with respect to the output of the inverter 68-3 and the output pointer signal po3.

In the data latch circuit 65-3, when the output pointer signal po3 is at the L-level, the output of the NAND circuit 72-3 is at the H-level. The nMOS transistor 66-3 is turned on when the input pointer signal pi3 is at the H-level in a state where the output pointer signal po0 is at the L-level, the output of the inverter 70-3 is at the H-level and the pMOS transistor 71-3 is turned off. Thereby, the latch circuit 77-3 latches the data pulse /RDP0.

Thereafter, the NAND circuit 72-3 outputs the data which is obtained by inverting the output of the inverter 68-3, that is, the latched data of the latch circuit 67-3 when the output pointer signal po3 is at the H-level in a state where the output pointer signal po0 is maintained at the L-level, the output of the inverter 70-3 is maintained at the H-level and the pMOS transistor 71-3 is maintained to be turned off.

Thereafter, when the output pointer signal po0 is at the H-level, the output of the inverter 70-3 is at the L-level, the pMOS transistor 71-3 is turned on and the level of a node Q3 is at the H-level. Thus, the latch circuit 67-3 latches the H-level, and the output of the inverter 68-3 is at the L-level and the output of the NAND circuit 72-3 is at the H-level.

The outputs of the NAND circuits 72-0, 72-1, 72-2 and 72-3 are subjected to a NAND operation performed by a NAND circuit 73.

Now referring to FIG. 5, the data output buffer 75 inputs the outputs of the first and second data latch circuit parts 52 and 53. That is, the data output buffer 75 inputs the output of the NAND circuits 63 and 73, and outputs the output data DQ0 to the pad 76.

Figure 9:
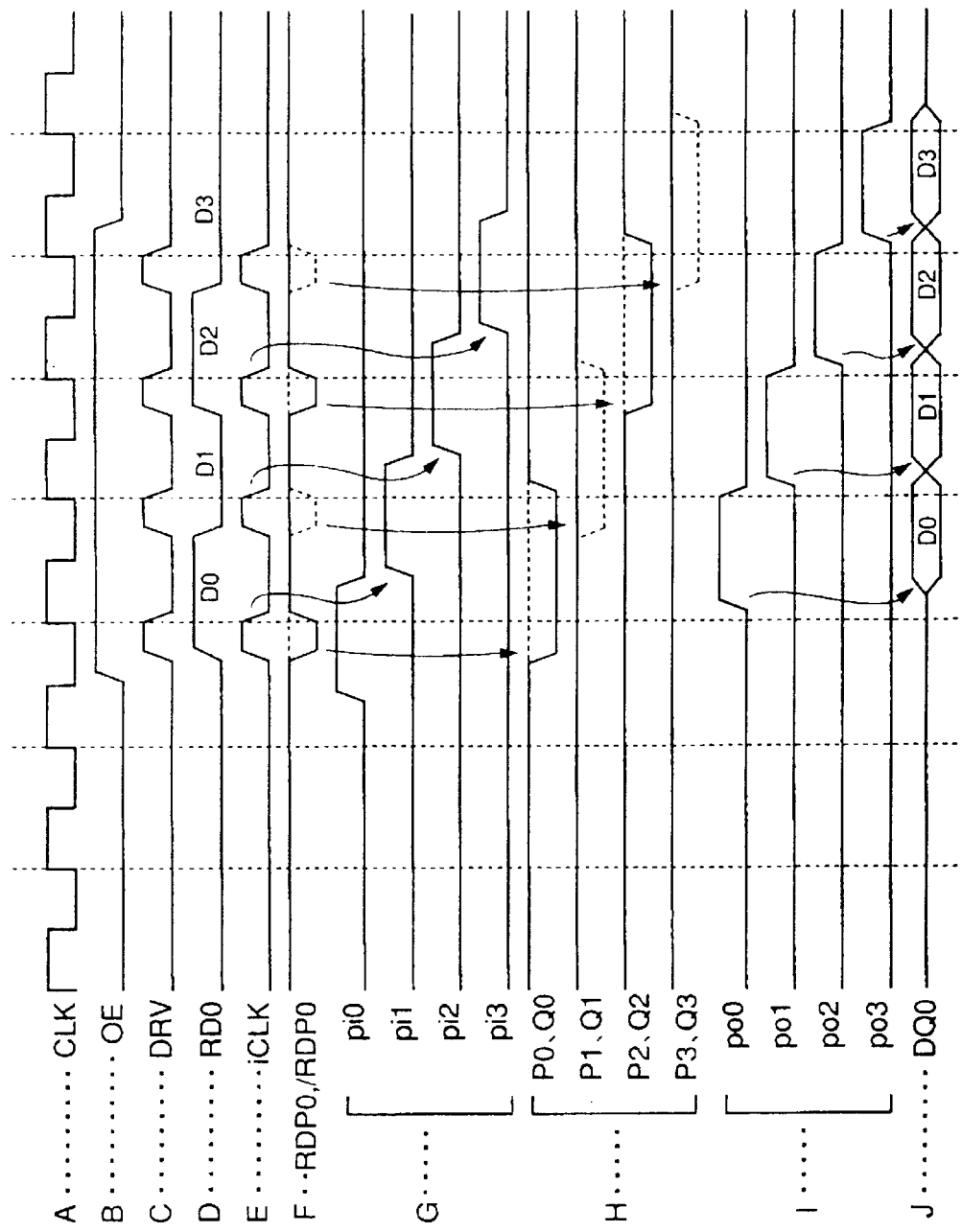
FIG. 9 is a timing chart of an operation of the synchronous DRAM shown in FIG. 5.

FIG. 9 is a timing chart of the synchronous DRAM shown in FIG. 5 when the burst length is set to 4. Waveform A in FIG. 9 indicates the external clock signal CLK. Waveform B in FIG. 9 indicates the output enable signal OE. Waveform C in FIG. 9 indicates the data bus drive circuit activating signal DRV. Waveform D in FIG. 9 indicates a potential of the data bus RD0. Waveform E in FIG. 9 indicates the data bus status shift monitoring signal ICLK. Waveform F in FIG. 9 indicates the data pulses RDP0 and /RDP0. Waveform G in FIG. 9 indicates the input pointer signals pi0, pi1, pi2 and pi3. Waveform H in FIG. 9 indicates a potential of nodes P0, P1, P2, P3, Q0, Q1, Q2 and Q3 of the first and second data latch circuits 52 and 53. Waveform I in FIG. 9 indicates output pointer signals po0, po1, po2 and po3. Waveform J in FIG. 9 indicates the output data DQ0 output to the pad 76.

In the above-mentioned second embodiment of the present invention, when a read command is input, the input pointer signal pi0 is at the H-level. It should be noted the data bus drive circuit activating signal DRV is at the L-level and the data buses RD0, RD1, . . . , RD7 are at the L-level before the data is read from the memory core part 1.

The read data DT0, DT1, . . . , DT7 are provided to the data bus drive circuits 10-0, 10-1, . . . , 10-7. In FIG. 9, the read data includes four data D0, D1, D2 and D3, and the four data are consecutively output to the data bus drive circuit 10-0. The data D0 is "logic 1=H-level", the data Di is "logic 0=L-level", the data D2 is "logic 1=H-level", and the data D3 is "logic 0=L-level".

Since the burst length is set to 4, the data bus drive circuit activating signal DRV shifts four times, as shown by waveform C in FIG. 9, from the L-level to the H-level in synchronization with the external clock signal CLK when the data bus is driven. As a result, as shown by waveform D in FIG. 9, during the first data transmission cycle, the potential of the data bus RD0 is changed to the H-level by the data bus drive circuit 10-0. The potential is maintained unchanged by the data bus potential holding circuit 26-0 until the next transmission cycle. During the second data transmission cycle, the potential of the data bus RD0 is changed to the L-level by the data bus drive circuit 10-0. The potential is maintained unchanged by the data bus potential holding circuit 26-0 until the next transmission cycle. Additionally, during the third data transmission cycle, the potential of the data bus RD0 is changed to the H-level by the data bus drive circuit 10-0. The potential is maintained unchanged by the data bus potential holding circuit 26-0 until the next transmission cycle. Further, during the fourth data transmission cycle, the potential of the data bus RD0 is changed to the L-level by the data bus drive circuit 10-0. The potential is maintained unchanged by the data bus potential holding circuit 26-0 until the next transmission cycle.

Additionally, when the potential of the data bus RD0 changes as shown by waveform D in FIG. 9, and the data bus status shift monitoring signal CLK changes as shown by waveform E in FIG. 9, the data pulses RDP0 and /RDP0 are changed as shown by waveform F in FIG. 9.

On the other hand, when the data bus drive circuit activating signal DRV changes as shown by waveform C in FIG. 9, the input pointer signals pi0, pi1, pi2 and pi3 change correspondingly as shown by waveform G in FIG. 9. As a result, the data pulse RDP0 output to the data pulse line 42 is sequentially latched by the data latch circuits 55-0, 55-1, 55-2 and 55-3, and the data pulse /RDP0 output to the data pulse line 43 is sequentially latched by the data latch circuits 65-0, 65-1, 65-2 and 65-3.

It should be noted that, in this embodiment, since the potential of the data pulse line 42 is maintained at the H-level and the potential of the nodes P0, P1, P2 and P3 is maintained at the H-level before the data latch circuits 55-0, 55-1, 55-2 and 55-3 input the data, the data of the previous cycle is not input to the data latch circuits 55-0, 55-1, 55-2 and 55-3. Similarly, since the potential of the data pulse line 43 is maintained at the H-level and the potential of the nodes Q0, Q1, Q2 and Q3 is maintained at the H-level before the data latch circuits 65-0, 65-1, 65-2 and 65-3 input the data, the data of the previous cycle is not input to the data latch circuits 65-0, 65-1, 65-2 and 65-3.

On the other hand, when a read command is input, the output enable signal OE is at the H-level as shown by waveform B in FIG. 9. Thus, the shift register 25 is changed to an active state. Thereby, as shown by waveform H in FIG. 9, the output pointer signals po0, po1, po2 and po3 are changed to the H-level sequentially one by one each time the external clock signal CLK rises. As a result, the data pulses RDP0 sequentially latched by the data latch circuits 55-0, 55-1, 55-2 and 55-3 are sequentially transmitted to the NAND circuit 63, and the data pulses /RDP0 sequentially latched by the data latch circuits 65-0, 65-1, 65-2 and 65-3 are sequentially transmitted to the NAND circuit 73. Then, the outputs of the NAND circuits 63 and 73 are supplied to the data output buffer 75. Thus, the data D0, D1, D2 and D3 output by data output buffer 75 are sequentially output as the output data DQ0 to the pad 76.

As mentioned above, according to the present embodiment, a wave pipeline operation is achieved by providing to the output circuit part 40-n (n=0, 1, 2, . . . , 7) the data latch circuits 55-0, 55-1, 55-2 and 55-3 which sequentially latch the data pulses RDP0 consecutively output to the data pulse line 42 and the data latch circuits 65-0, 65-1, 65-2 and 65-3 which sequentially latch the data pulses /RDP0 consecutively output to the data pulse line 43.

Additionally, since the single line data buses RD0, RD1, ..., RD7 are provided as a data bus for transmitting the read data DT0, DT1, ..., DT7, there is no need to precharge the data buses RD0, RD1, ..., RD7 for each data transmission cycle. Thus, the status of the data buses RD0, RD1, ..., RD7 changes once during a single clock cycle time.

Accordingly, the frequency of activation of the data buses can be set to substantially one half of that of the conventional synchronous DRAM, and, thereby, the current for charging the data buses RD0, RD1, ..., RD7 can be reduced to one half. Thus, power consumption of the synchronous DRAM according to the present embodiment is decreased.

Additionally, in the output circuit parts 40-n (n=0, 1, 2, ..., 7), a timing of latching of the first and second data latch circuit parts 52 and 53 can be easily controlled since the data bus status shift monitoring signal generating circuit 18 is provided to generate the data bus status shift monitoring signal iCLK and the shift register 24 is provided which inputs the data bus status shift monitoring signal iCLK and outputs the input pointer signals pi0, pi1, pi2 and pi3.

Additionally, in the present embodiment, the data bus potential holding circuits 26-0, 26-1, ..., 26-7 are provided to hold the data buses RD0, RD1, ..., RD7 at the potential provided by the data bus drive circuits 10-0, 10-1, ..., 10-7. Thus, a structure which does not require a precharge of the data buses for each clock cycle can be achieved by a simple circuit structure.

The present invention is not limited to the specifically disclosed embodiments, and variations and modifications may be made without departing from the spirit and scope of the present invention.

What is claimed is:

1. A semiconductor memory comprising:

a single line data bus transmitting read data output from a memory core part of said semiconductor memory;

a data bus drive circuit outputting the read data to send to said single data bus;

a plurality of data latch circuits each of which has a data input terminal connected to said data bus;

a data input control circuit provided so as to input read data serially transmitted on said data bus to said data latch circuits in parallel in response to an operation of said data bus drive circuit; and a data output control circuit provided so as to output latched read data from the latch circuits in an order of latching by sequentially selecting outputs of said data latch circuits.

2. The semiconductor memory as claimed in claim 1, wherein both of said data input control circuit and said data bus drive circuit are coupled to receive a data bus drive circuit activating signal.

3. The semiconductor memory as claimed in claim 1, further comprising a data bus potential holding circuit holding a potential on said data bus.

4. The semiconductor memory device as claimed in claim 1, further comprising a data bus drive activating signal generating means for generating an activating signal for activating the operation of said data bus drive circuit.

5. A semiconductor memory comprising:

a single line data bus transmitting read data output from a memory core part of said semiconductor memory;

a data pulse generating circuit coupled to a first data pulse line and a second data pulse line, said data pulse generating circuit generating first data pulses and second data pulses from read data being transmitted on said data bus so that said first data pulses and said second data pulses are complementary with each other;

a plurality of first data latch circuits each of which has an input terminal connected to said first data pulse line;

a plurality of second data latch circuits each of which has an input terminal connected to said second data pulse line;

a data input control circuit controlling said first data latch circuits and said second data latch circuits to input said first data pulse to said first data latch circuits and input said second data pulse to said second data latch circuits by sequentially controlling said first data latch circuits and said second data latch circuits to be in a data input state; and a data output control circuit controlling said first data latch circuits and said second data latch circuits to sequentially output the read data in an order of latching by sequentially controlling said first data latch circuits and said second data latch circuits to be in a data output state.

6. The semiconductor memory as claimed in claim 5, further comprising a data bus drive circuit and data bus potential holding circuit, said data bus drive circuit providing a potential to said data bus so as to output the read data to said data bus, said data bus potential holding circuit holding the potential provided by said data bus drive circuit.

7. The semiconductor memory as claimed in claim 5, wherein said data input control circuit comprises a data bus status shift monitoring signal generating circuit generating a data bus status shift monitoring signal indicative of a timing of shift in a status of said data bus by monitoring a status of a data bus drive circuit, wherein said data pulse generating circuit is controlled based on said data bus status monitoring signal to generate said first and second data pulses.

8. The semiconductor memory as claimed in claim 7, wherein said data input control circuit controls a timing of input of the read data to said first and second data latch circuits based on said data bus status shift monitoring signal.

* * * * *